United States Patent
Zhang et al.

(10) Patent No.: US 10,153,612 B1
(45) Date of Patent: Dec. 11, 2018

(54) TUNABLE LASER BIAS CIRCUIT

(71) Applicant: Google LLC, Mountain View, CA (US)

(72) Inventors: Tao Zhang, Mountain View, CA (US);
Xiangjun Zhao, Fremont, CA (US);
Changhong Joy Jiang, Dublin, CA (US); Liang Du, Santa Clara, CA (US);
Shuang Yin, Sunnyvale, CA (US);
Cedric Fung Lam, San Carlos, CA (US); Adam Edwin Taylor Barratt, Portland, OR (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/799,118

(22) Filed: Oct. 31, 2017

(51) Int. Cl.
| | |
|---|---|
| *H01S 5/0625* | (2006.01) |
| *H01S 5/042* | (2006.01) |
| *H01S 5/125* | (2006.01) |
| *H01S 5/12* | (2006.01) |
| *H03F 3/45* | (2006.01) |
| *H04B 10/27* | (2013.01) |
| *H04J 14/02* | (2006.01) |
| *H04B 10/50* | (2013.01) |

(52) U.S. Cl.
CPC .......... *H01S 5/06256* (2013.01); *H01S 5/042* (2013.01); *H01S 5/125* (2013.01); *H01S 5/1234* (2013.01); *H03F 3/45475* (2013.01); *H03F 2203/45116* (2013.01); *H03F 2203/45151* (2013.01); *H04B 10/27* (2013.01); *H04B 10/503* (2013.01); *H04J 14/02* (2013.01)

(58) Field of Classification Search
CPC ...... H01S 5/3407; H01S 5/34346; H01S 5/22; H01S 5/0287; H01S 5/34333; H01S 5/026; H01S 2304/04
See application file for complete search history.

(56) References Cited

U.S. PATENT DOCUMENTS

2006/0098699 A1* 5/2006 Sanchez ................. H01S 5/068
372/26
2013/0101290 A1 4/2013 Anandarajah et al.

FOREIGN PATENT DOCUMENTS

WO WO-1998057402 A1 12/1998

* cited by examiner

*Primary Examiner* — Dung Nguyen
(74) *Attorney, Agent, or Firm* — Honigman Miller Schwartz and Cohn LLP

(57) ABSTRACT

A method includes receiving a mode control signal indicative of a current-mode or a voltage-mode. When the mode control signal is indicative of the voltage-mode, the method includes connecting a voltage-mode bias sub-circuit to an anode of a reflector-section diode and applying an adjustable bias voltage to bias a diode voltage at the anode of the reflector-section diode. The reflector-section diode is disposed on a shared substrate of a tunable laser. When the mode control signal is indicative of the current-mode, the method includes connecting a current-mode bias sub-circuit to the anode of the reflector-section diode and delivering an adjustable bias current to the anode of the reflector-section diode.

26 Claims, 11 Drawing Sheets

TUNABLE LASER BIAS CIRCUIT

TECHNICAL FIELD

This disclosure relates to a bias circuit for a tunable laser.

BACKGROUND

Fiber optic communication is an emerging method of transmitting information from a source (transmitter) to a destination (receiver) using optical fibers as the communication channel. A Wavelength-Division Multiplexing Passive Optical Network (WDM-PON) is an optical technology for access and backhaul networks. WDM-PON uses multiple different wavelengths over a physical point-to-multipoint fiber infrastructure that contains passive optical components. The use of different wavelengths allows for traffic separation within the same physical fiber. The result is a network that provides logical point-to-point connections over a physical point-to-multipoint network topology. WDM-PON allows operators to deliver high bandwidth to multiple endpoints over long distances. A PON generally includes an optical line terminal located at a service provider central office (e.g., a hub), a remote node connected to the central office by a feeder fiber, and a number of optical network units or optical network terminals, near end users. The remote node demultiplexes an optical signal from the central office and distributes the demultiplexed optical signals to multiple optical network units (ONUs) along corresponding distribution fibers.

Generally, the more wavelengths that can be stacked by the WDM-PON, the more information that can be carried by a single distribution fiber to lower infrastructure construction and management costs of the WDM-PON. Wavelength tuning of a tunable laser in the ONU for generating the upstream optical signal is generally carried out by adjusting an injection current applied to the tunable laser. Temperature control through a Thermoelectric Cooler (TEC) circuit may additionally fine-tune the wavelength of the tunable laser. Extending the wavelength tuning range, however, is strongly dependent upon fabrication technology employed by the tunable laser. Accordingly, a tunable laser will typically undergo a costly re-fabrication to extend the wavelength tuning range in order to provide additional wavelengths to meet increases in the amount of data being transmitted over the WDM-PON.

SUMMARY

One aspect of the disclosure provides a method for extending a wavelength tuning range of a tunable laser. The method includes receiving, at a laser biasing circuit, a mode control signal indicative of a current-mode or a voltage-mode. The laser biasing circuit includes a current-mode bias sub-circuit and a voltage-mode bias sub-circuit. When the mode control signal is indicative of the voltage-mode, the method includes connecting, by the laser biasing circuit, the voltage-mode bias sub-circuit to an anode of a reflector-section diode. The reflector-section diode is disposed on a shared substrate of the tunable laser. When the mode control signal is indicative of the voltage-mode, the method also includes applying, by the voltage-mode bias sub-circuit, an adjustable bias voltage to bias a diode voltage at the anode of the reflector-section diode. When the mode control signal is indicative of the current-mode, the method includes connecting, by the laser biasing circuit, the current-mode bias sub-circuit to the anode of the reflector-section diode. When the mode control signal is indicative of the current-mode, the method further includes delivering, by the current-mode bias sub-circuit, an adjustable bias current to the anode of the reflector-section diode.

Implementations of the disclosure may include one or more of the following optional features. In some implementations, when the mode control signal is indicative of the current-mode, the method includes disconnecting the voltage-mode bias sub-circuit from the anode of the reflector-section diode to isolate the adjustable bias voltage from biasing the diode voltage at the anode of the reflector-section diode. When the mode control signal is indicative of the voltage-mode, the method may include disconnecting the current-mode bias sub-circuit from the anode of the reflector-section diode to prevent delivery of the adjustable bias current to the anode of the reflector-section diode. Optionally, when the mode control signal is indicative of the current-mode, the reflector-section diode may receive a diode current equal to a magnitude of the adjustable bias current. Further, when the mode control signal is indicative of the voltage-mode, the diode voltage at the anode of the reflector-section diode may be negative or positive based on a magnitude of the adjustable bias voltage applied by the voltage-mode bias sub-circuit. Additionally or alternatively, a magnitude of a diode current received by the reflector-section diode may be less when the mode control signal is indicative of the voltage-mode than when the mode control signal is indicative of the current-mode.

In some configurations, the laser biasing circuit includes first and second metal-oxide-semiconductor field-effect transistors (MOSFETs). Each MOSFET may be connected to a mode control signal source. The first MOSFET may be connected to the anode of the reflector-section diode and to an output of an operational amplifier. The operational amplifier may have a negative input node connected to a first resistor, the first resistor connected to an adjustable voltage bias source. The second MOSFET may be connected to a regulator voltage source and an inductor, the inductor connected to the anode of the reflector-section diode. In this configuration, when the mode control signal is indicative of the voltage-mode, the first MOSFET is configured to turn on to apply the adjustable bias voltage to bias the diode voltage at the anode of the reflector-section diode. Further, when the mode control signal is indicative of the current-mode, the second MOSFET may be configured to turn on to deliver the adjustable bias current from the regulator voltage source to the anode of the reflector-section diode. Optionally, the first MOSFET may include an n-channel MOSFET and the second MOSFET may include a p-channel MOSFET.

In some examples, when the laser biasing circuit includes first and second MOSFETs, the MOSFETs are each connected to the mode control signal source and a voltage source. The first MOSFET may be connected to a positive input node of an operational amplifier. The second MOSFET may be connected to an output of the operational amplifier. In this example, when the mode control signal is indicative of the current-mode, the first and second MOSFETs are configured to turn on. In some implementations, the tunable laser includes a multi-section tunable laser.

Another aspect of the disclosure provides a laser biasing circuit for extending a wavelength tuning range of a tunable laser. The laser biasing circuit includes a voltage-mode bias sub-circuit, a current-mode bias sub-circuit, and first and second MOSFETs configured to receive a mode control signal indicative of a current-mode or a voltage-mode. When the mode control signal is indicative of the voltage-mode, the voltage-mode bias sub-circuit is configured to connect to an anode of a reflector-section diode. The reflector-section diode disposed on a shared substrate of the tunable laser. When the mode control signal is indicative of the voltage-mode, the voltage-mode bias sub-circuit is also configured to apply an adjustable bias voltage to bias a diode voltage at the anode of the reflector-section diode. When the mode control signal is indicative of the current-mode, the current-mode bias sub-circuit is configured to connect to the anode of the reflector-section diode and to deliver an adjustable bias current to the anode of the reflector-section diode.

Implementations of the disclosure may include one or more of the following optional features. In some configurations, when the mode control signal is indicative of the current-mode, the voltage-mode bias sub-circuit is configured to disconnect from the anode of the reflector-section diode to isolate the adjustable bias voltage from biasing the diode voltage at the anode of the reflector-section diode. When the mode control signal is indicative of the voltage-mode, the current-mode bias sub-circuit may be configured to disconnect from the anode of the reflector-section diode to prevent delivery of the adjustable bias current to the anode of the reflector-section diode. Optionally, when the mode control signal is indicative of the current-mode, the reflector-section diode may receive a diode current equal to a magnitude of the adjustable bias current. Additionally or alternatively, when the mode control signal is indicative of the voltage-mode, the diode voltage at the anode of the reflector-section diode may be negative or positive based on a magnitude of the adjustable bias voltage applied by the voltage-mode bias sub-circuit. In some examples, a magnitude of a diode current received by the reflector-section diode is less when the mode control signal is indicative of the voltage-mode than when the mode control signal is indicative of the current-mode.

In some examples, the first MOSFET is connected to the anode of the reflector-section diode and to an output of an operational amplifier. The operational amplifier may have a negative input node connected to a first resistor, the first resistor connected to an adjustable voltage bias source. Further, the second MOSFET may be connected to a regulator voltage source and an inductor, the inductor connected to the anode of the reflector-section diode. In this example, the first MOSFET is configured to turn on to apply the adjustable bias voltage to bias the diode voltage at the anode of the reflector-section diode when the mode control signal is indicative of the voltage-mode. Additionally or alternatively, the second MOSFET may be configured to turn on to deliver the adjustable bias current from the regulator voltage source to the anode of the reflector-section diode when the mode control signal is indicative of the current-mode. Optionally, the first MOSFET may include an n-channel MOSFET and the second MOSFET may include a p-channel MOSFET.

In some implementations, the system includes a third MOSFET connected to a voltage source and a positive input node of an operational amplifier. The third MOSFET may be configured to receive the mode control signal indicative of the current-mode or the voltage-mode. The system may further include a fourth MOSFET connected to the voltage source and an output of the operational amplifier. The third and fourth MOSFETS may be configured to turn on when the mode control signal is indicative of the current-mode. In some implementations, the tunable laser includes a multi-section tunable laser.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
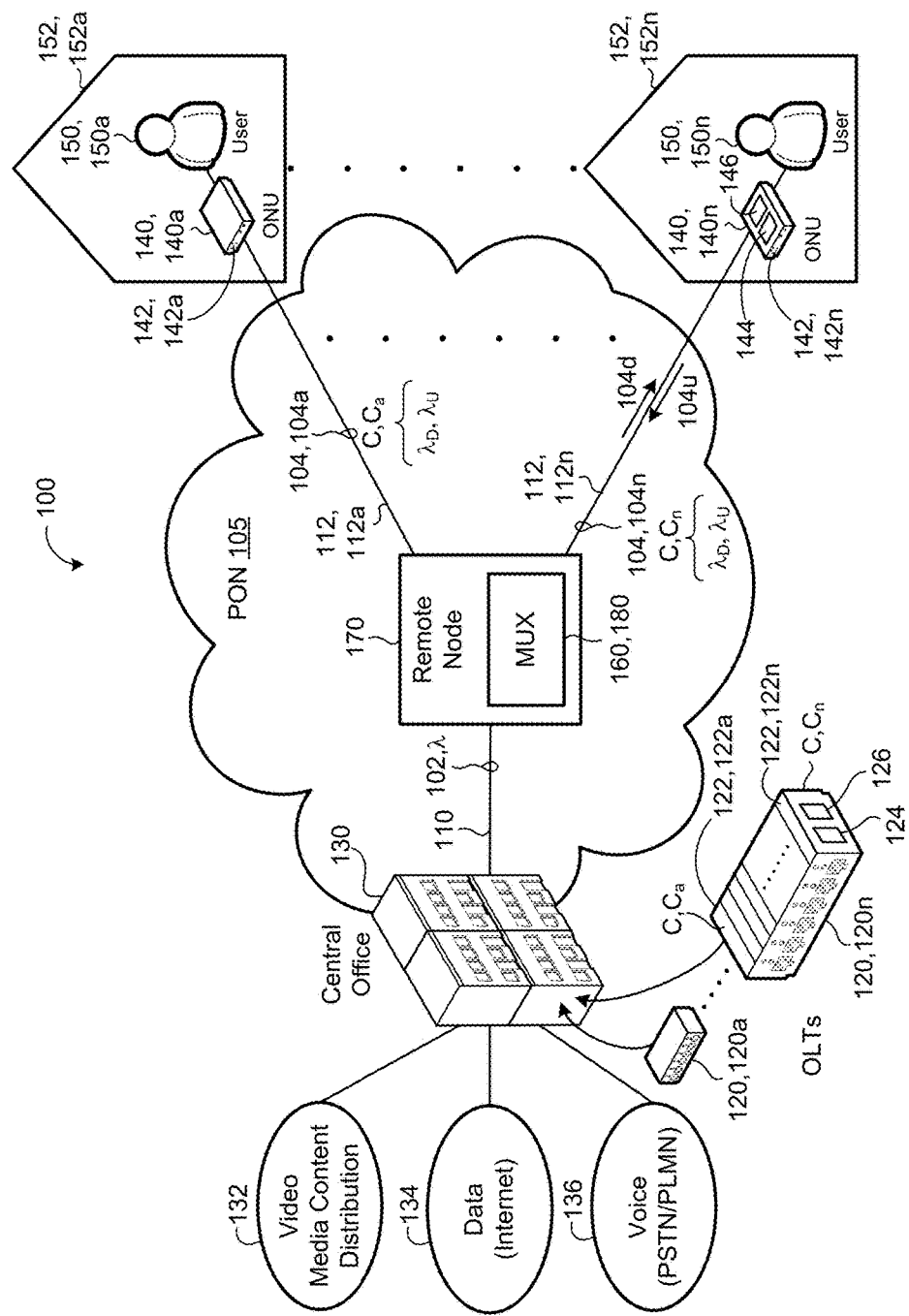
FIG. 1 is a schematic view of an example communication system.

Referring to FIG. 1, an optical communication system 100 delivers communication signals 102 (e.g., optical signals) through communication links 110, 112, 112a-n (e.g., optical fibers or line-of-sight free space optical communications) between an optical line terminal (OLT) 120 housed in a central office (CO) 130 and optical network units (ONUs) 140, 140a-n (e.g., a bidirectional optical transceiver) associated with users 150, 150a-n (also referred to as customers or subscribers). The ONUs 140, 140a-n are typically located at premises 152, 152a-n of the users 150, 150a-n.

Customer premises equipment (CPE) is any terminal and associated equipment located at the premises 152 of the user 150 and connected to a carrier telecommunication channel C at a demarcation point ("demarc"). In the examples shown, the ONU 140 is a CPE. The demarc is a point established in a house, building, or complex to separate customer equipment from service provider equipment. CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150a-n is terminated by a separate OLT 120a-n. In other examples, the optical communication system 100 implements a point-to-multi-point (pt-2-multi-pt) PON, where a shared OLT 120 services multiple customers 150, 150a-n.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122, 122a-n, depending on the implementation of the optical access network 105. The OLT 120 sends the optical signal 102 via a corresponding transceiver 122, through a feeder fiber 110 to a remote node (RN) 170, which includes a band-multiplexer 160 configured to demultiplex the optical signal 102 and distribute demultiplexed optical signals 104 to multiple users 150, 150a-n along corresponding distribution fibers 112, 112a-n. The band-multiplexer 160 for multiplexing/demultiplexing may be an arrayed wavelength grating 180 (AWG), which is a passive optical device. In some examples, each CO 130 includes multiple OLTs 120, 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 110. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths $\lambda$ to implement point-to-multi-point communications in the PON 105. The OLT 120 serves multiple wavelengths through one fiber 110 to the band-multiplexer 160 at the RN 170, which multiplexes/demultiplexes signals between the OLT 120 and a plurality of ONUs 140, 140a-n. Multiplexing combines several input signals and outputs a combined signal. Time wavelength division multiplexing (TWDM) uses both time and wavelength dimensions to multiplex signals.

For WDM and dense-WDM (DWDM), the OLT 120 includes multiple optical transceivers 122, 122a-n. Each optical transceiver 122 transmits signals at one fixed wavelength $\lambda_D$ (referred to as a downstream wavelength) and receives optical signals 102 at one fixed wavelength $\lambda_U$ (referred to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the band-multiplexer 160 at the RN 170 multiplexes/demultiplexes optical signals 102, 104, 104-n between the OLT 120 and a plurality of ONUs 140, 140a-n. For example, for downstream communications, the band-multiplexer 160 demultiplexes the optical signal 102 from the OLT 120 into ONU optical signals 104, 104a-n, i.e., downstream optical signals 104d, for each corresponding ONU 140, 140a-n. For upstream communications, the band-multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122.

In some implementations, each ONU 140, 140a-n includes a corresponding tunable ONU transceiver 142, 142a-n (e.g., that includes a laser or light emitting diode) that can tune to any wavelength $\lambda$ used by a corresponding OLT 120 at a receiving end. The ONU 140 may automatically tune the tunable ONU transceiver 142 to a wavelength $\lambda$ that establishes a communication link between the corresponding OLT 120 and the ONU 140. Each optical transceiver 122, 142 may include data processing hardware 124, 144 (e.g., control hardware, circuitry, field programmable gate arrays (FPGAs, etc.) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. The ONU 140 may include a photodetector that converts the optical wave to an electrical form. The electrical signal may be further de-multiplexed down to subcomponents (e.g., data over a network, sound waves converted into currents using microphones and back to its original physical form using speakers, converting images converted into currents using video cameras and converting back to its physical form using a television). Additional details on auto-tuning the ONU 140 to communicate with the corresponding OLT 120 can be found in U.S. patent application Ser. No. 15/354,811, filed on Nov. 17, 2016, which is hereby incorporated by reference in its entirety.

Figure 2:
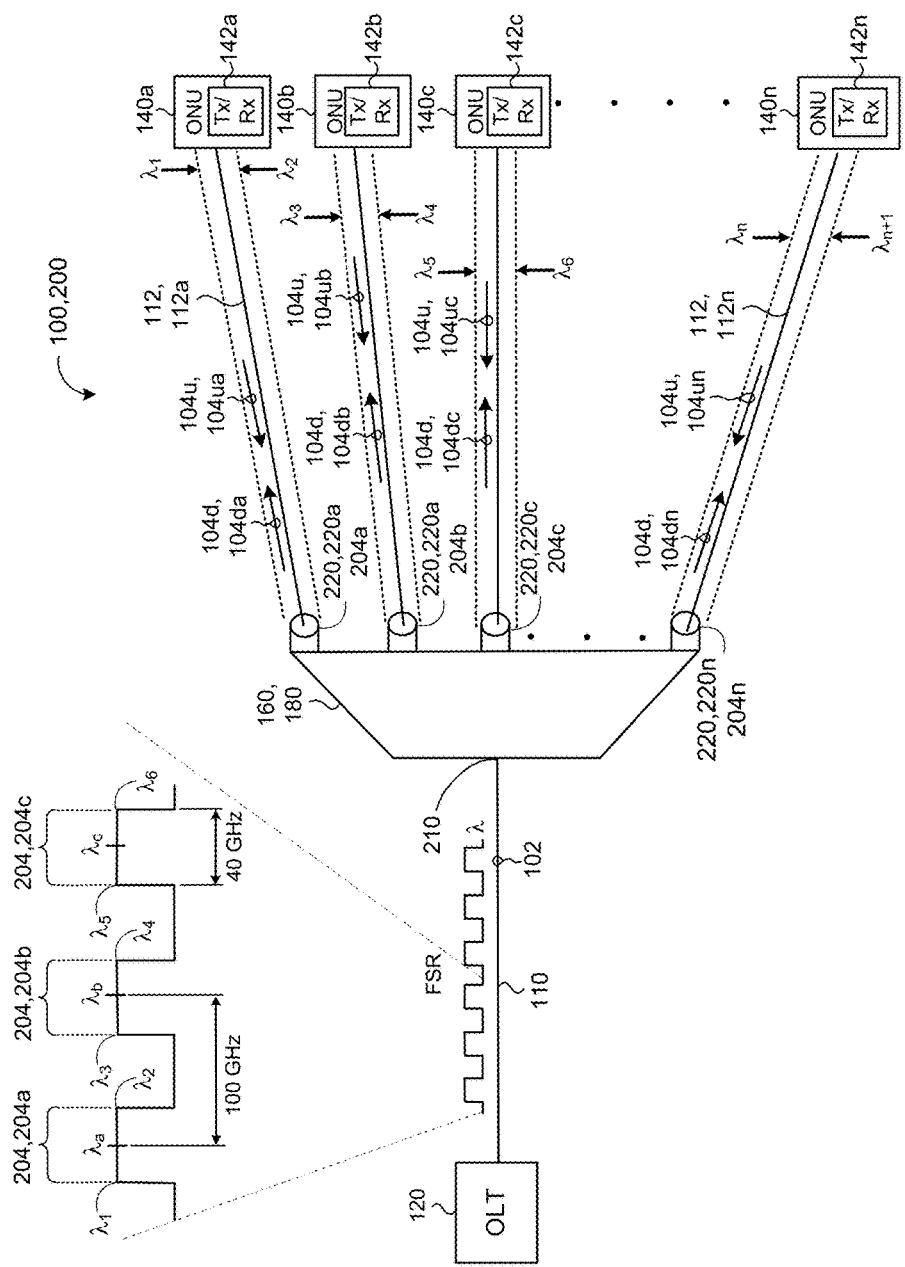
FIG. 2 is a schematic view of an example dense-wavelength division multiplexing architecture for a communication system.

FIG. 2 illustrates an example DWDM architecture 200 for the communication system 100 that facilitates user aggregation onto a single strand of fiber 110, 112, 112a-n. An exemplary arrayed waveguide grating 180 (AWG), which may be used as a band-multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths $\lambda$ for each corresponding ONU 140, 140a-n. The AWG 180 may reciprocally multiplex upstream ONU optical signals 104u, 104ua-104un of different wavelengths $\lambda$ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n. Each demultiplex port 220 is optically coupled to a corresponding ONU 140 of the plurality of ONUs 140, 140a-n. In some examples, the AWG 180 is disposed at the RN 170. In other examples, the AWG 180 is disposed OLT 120, or more specifically, co-located with the OLT 120 at the CO 130.

The AWG 180 is cyclic in nature. The wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. In the example shown, each of the multiple wavelengths λ of the FSR are separated by about 100 Gigahertz (GHz) with a wavelength pass-band 204 of about 40 GHz. For instance, first, second, and third wavelengths $\lambda_a$, $\lambda_b$, $\lambda_c$ are each separated by 100 GHz and associated with a corresponding wavelength pass-band 204, 204a-c of about 40 GHz. However, in other configurations, the wavelength pass-band 204 may be greater than or equal to 40 GHz. The wavelength pass-band 204a associated with wavelength $\lambda_a$ is defined by lower and upper wavelength limits $\lambda_1$, $\lambda_2$, the wavelength pass-band 204b associated with wavelength λb is defined by lower and upper wavelength limits $\lambda_3$, $\lambda_4$, and the wavelength pass-band 204c associated with wavelength $\lambda_c$ is defined by lower and upper wavelength limits $\lambda_5$, $\lambda_6$. The wavelength pass-bands 204 may be separated by a range of wavelengths associated with a stop-band. In the example shown, a stop-band is defined between the upper wavelength limit 22 of the wavelength pass-band 204a and the lower wavelength limit $\lambda_3$ of the wavelength pass-band 204b, and another stop-band is defined between the upper wavelength limit 24 of the wavelength pass-band 204b and the lower wavelength limit $\lambda_5$ of the wavelength pass-band 204c.

In some implementations, each demultiplex port 220, 220a-n of the AWG 180 is associated with a corresponding one of the wavelength pass-bands 204, 204a-n. Here, the AWG 180 is configured to allow passage therethrough of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage therethrough of those upstream optical signals 104u. In the example shown, the ONU transceiver 142a of the ONU 140a transmits a corresponding optical signal 104ua at a wavelength within the wavelength pass-band 204a of the corresponding demultiplex port 220a. For instance, the wavelength of the optical signal 104ua is greater than the lower wavelength limit $\lambda_1$ and less than the upper wavelength limit $\lambda_2$ of the wavelength pass-band 204a. Similarly, each ONU transceiver 142b-n of the ONUs 140b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 400 (FIGS. 3A, 3B, and 4), usually a semiconductor laser, configured to transmit upstream optical signals 104u at a corresponding wavelength to the OLT 120. In order to tune the wavelength of the upstream optical signals 104u, conventional wavelength tuning techniques include adjusting a magnitude of injection current delivered to the tunable laser 400 during a linear region. Temperature control, such as through the use of a Thermoelectric Cooler (TEC) circuit, may be further employed to fine-tune the wavelength. As the need for wider wavelength tuning ranges at ONUs 140 increases, the tunable lasers 400 generally require re-fabrication so that the wavelength tuning ranges can be extended. In addition to the high costs that incur from having to re-fabricate the tunable lasers 400 at the ONUs 140, the fabrication process may be highly-complex.

Figure 3A:
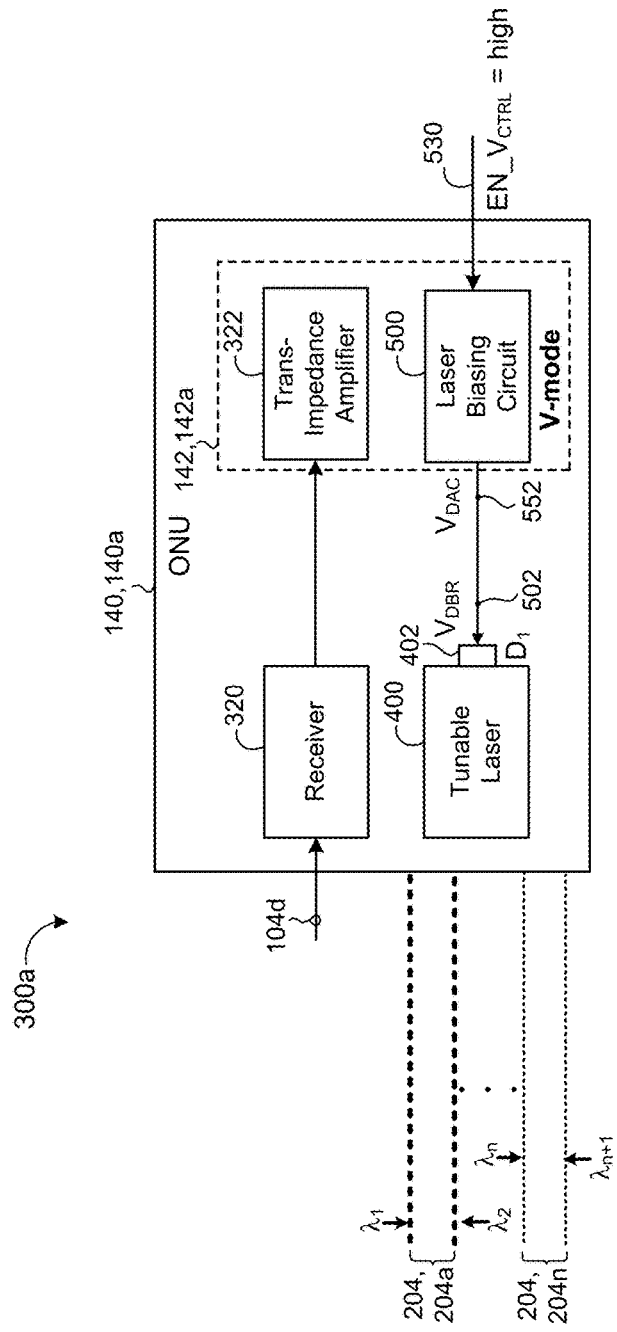
FIG. 3A is a schematic view of an optical network unit having a tunable laser and laser biasing circuit configured to operate in a voltage-mode for applying an adjustable bias voltage to bias a reflector-section diode for expanding a wavelength tuning range of the tunable laser.
Figure 3B:
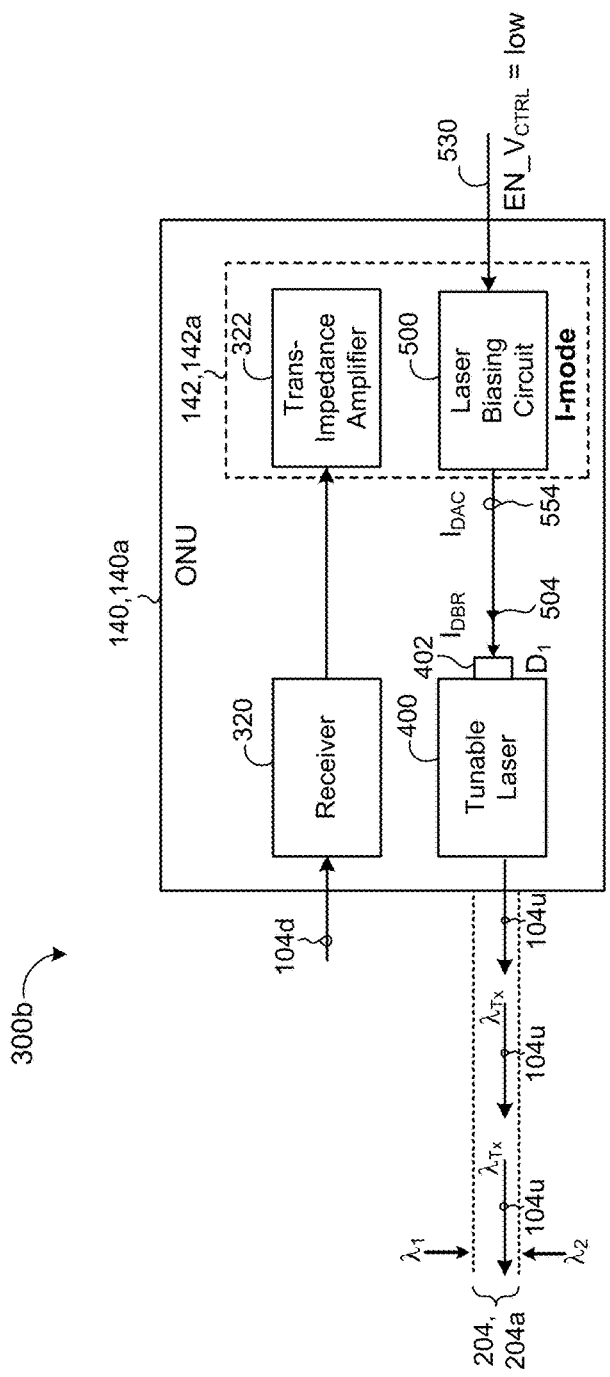
FIG. 3B is a schematic view of an optical network unit having a tunable laser and laser biasing circuit configured to operate in a current-mode for delivering an adjustable bias current to bias a reflector-section diode for tuning a wavelength of the tunable laser.

Referring to FIGS. 3A and 3B, in some implementations, the ONU transceiver 142, 142a of the ONU 140, 140a of the communication system 100 includes a laser biasing circuit 500 for a tunable laser 400 configured to operate in a voltage-mode (FIG. 3A), for applying an adjustable bias voltage $V_{DAC}$ 552 to bias a diode voltage $V_{DBR}$ 502 at an anode of a reflector-section diode $D_1$ 402 of the tunable laser 400, and in a current-mode (FIG. 3B), for delivering an adjustable bias current $I_{DAC}$ 554 to the anode of the reflector-section diode $D_1$ 402 of the tunable laser 400. The ONU transceiver 142 includes a trans-impedance amplifier (TIA) 322 configured to receive downstream optical signals 104d through a photo-diode 320 from the OLT 120 that have been demultiplexed by the band-multiplexer 160. The data processing hardware (e.g., control hardware) 144, 144a of the ONU 140 implements the laser biasing circuit 500 to electrically connect a current-mode bias sub-circuit 500b (FIG. 5B) to the anode of the reflector-section diode 402 during the current mode (I-mode) or a voltage-mode bias sub-circuit 500c (FIG. 5C) to the anode of the reflector-section diode 402 during the voltage mode (V-mode).

In some configurations, the tunable laser 400 includes a multi-section structure with each section/structure sharing a single substrate. For example, the laser 400 may include a tunable distributed Bragg reflector (DBR) laser having a DBR section, phase section, and a gain section on a same substrate. Each section may include a corresponding diode ($D_0$, $D_1$, $D_2$) and may be driven by a corresponding injection current ($I_{GAIN}$, $I_{PHASE}$, $I_{DBR}$). The laser 400 is not limited to DBR lasers and may correspond to any multi-section tunable laser 400. The DBR section may hereinafter be referred to as a reflector-section including a corresponding reflector-section diode $D_1$ 402. The reflect-section diode $D_1$ 402 is configured to receive a diode current $I_{DBR}$ 504 (e.g., injection current 504) for tuning a wavelength of the laser 400 at the DBR section (e.g., reflector-section).

Referring to FIG. 3A, the schematic view 300a shows the ONU 140 biasing the tunable laser 400 to cover a sub-threshold region and a reverse-biased region in order to extend the wavelength tuning range of the laser 400. Here, the laser biasing circuit 500 applies the adjustable bias voltage $V_{DAC}$ 552 to bias the diode voltage $V_{DBR}$ 502 at the reflector-section diode $D_1$ 402 to the sub-threshold region or the reverse-biased region. The diode voltage $V_{DBR}$ 502 biased by the adjustable bias voltage $V_{DAC}$ 552 may be positive (sub-threshold region) or negative (reversed-biased region) based on the magnitude of the adjustable bias voltage $V_{DAC}$ 552. In some examples, the laser biasing circuit 500 receives a mode control signal (EN_$V_{CTRL}$) 530 indicative of the V-mode (e.g., EN_$V_{CTRL}$=high) that causes the biasing circuit 500 to apply the adjustable bias voltage $V_{DAC}$ 552 to the anode of the reflector-section diode $D_1$ 402. The adjustable bias voltage $V_{DAC}$ may bias the tunable laser 400 at the sub-threshold region when positive or at the reverse-bias region when negative in order to maximize/extend/widen the wavelength tuning range of the tunable laser 400.

In the example shown, the wavelength tuning range of the laser 400 is extended to include all wavelengths between the lower wavelength limit $\lambda_1$ of the wavelength pass-band 204, 204a of the band-multiplexer 160 (e.g., AWG 180) and the upper wavelength limit $\lambda_{n+1}$ of the wavelength pass-band 204, 202n of the band-multiplexer 160. Accordingly, the tunable laser 400 may transmit (or receive) an optical signal 104u at a corresponding transmit (or receive) optical wavelength $\lambda_{Tx}$ within any of the wavelength pass-bands 204a-n of the band-multiplexer 160 (e.g., AWG 180). FIG. 3A shows the laser biasing circuit 500 biasing the tunable laser 400 to the sub-threshold region and/or the reverse-bias to thereby extend/maximize/widen the wavelength tuning range. Without application of the adjustable bias voltage $V_{DAC}$ 552 to bias the diode voltage $V_{DBR}$ 502 at the reflector-section diode $D_1$ 402, the wavelength tuning range of the tunable laser 400 would not be extended to encompass all of the wavelengths between the wavelength limits $\lambda_1$, $\lambda_{n+1}$. Rather, the tunable laser 400 would include a narrower wavelength tuning range, thereby reducing the number of wavelengths the tunable laser 400 can generate.

Referring to FIG. 3B, the schematic view 300b shows the laser biasing circuit 500 biasing the tunable laser 400 to transmit the optical signal 104u at the transmit wavelength $\lambda_{Tx}$ within the wavelength pass-band 204, 204a of the band-multiplexer 160 (e.g., AWG 180). Here, the laser biasing circuit 500 delivers the adjustable bias current $I_{DAC}$ 555 to bias a diode current $I_{DBR}$ 504 at the reflector-section diode $D_1$ 402 in a linear region. Accordingly, while the laser biasing circuit 500 may bias the diode voltage $V_{DBR}$ 502 at the anode of the reflector-section diode 402 by applying the adjustable bias voltage $V_{DAC}$ 552 during the V-mode (FIG. 3A), the laser biasing circuit 500 may deliver the adjustable bias current $I_{DAC}$ during the I-mode to bias the diode current $I_{DBR}$ 504 to generate a desired wavelength, e.g., the transmit wavelength $\lambda_{Tx}$ within the wavelength pass-band 204a of the band-multiplexer 160. The band-multiplexer 160 is configured to allow passage therethrough of the optical signal 104u at the transmit wavelength $\lambda_{Tx}$. In some examples, the laser biasing circuit 500 receives a mode control signal ($EN\_V_{CTRL}$) 530 indicative of the I-mode (e.g., $EN\_V_{CTRL}$=low) that causes the biasing circuit 500 to apply the adjustable bias current $I_{DAC}$ 554 to the anode of the reflector-section diode $D_1$ 402. The adjustable bias current $I_{DAC}$ may bias the tunable laser 400 at the linear region in order to tune the tunable laser 400 to generate a desired wavelength $\lambda$.

Figure 4:
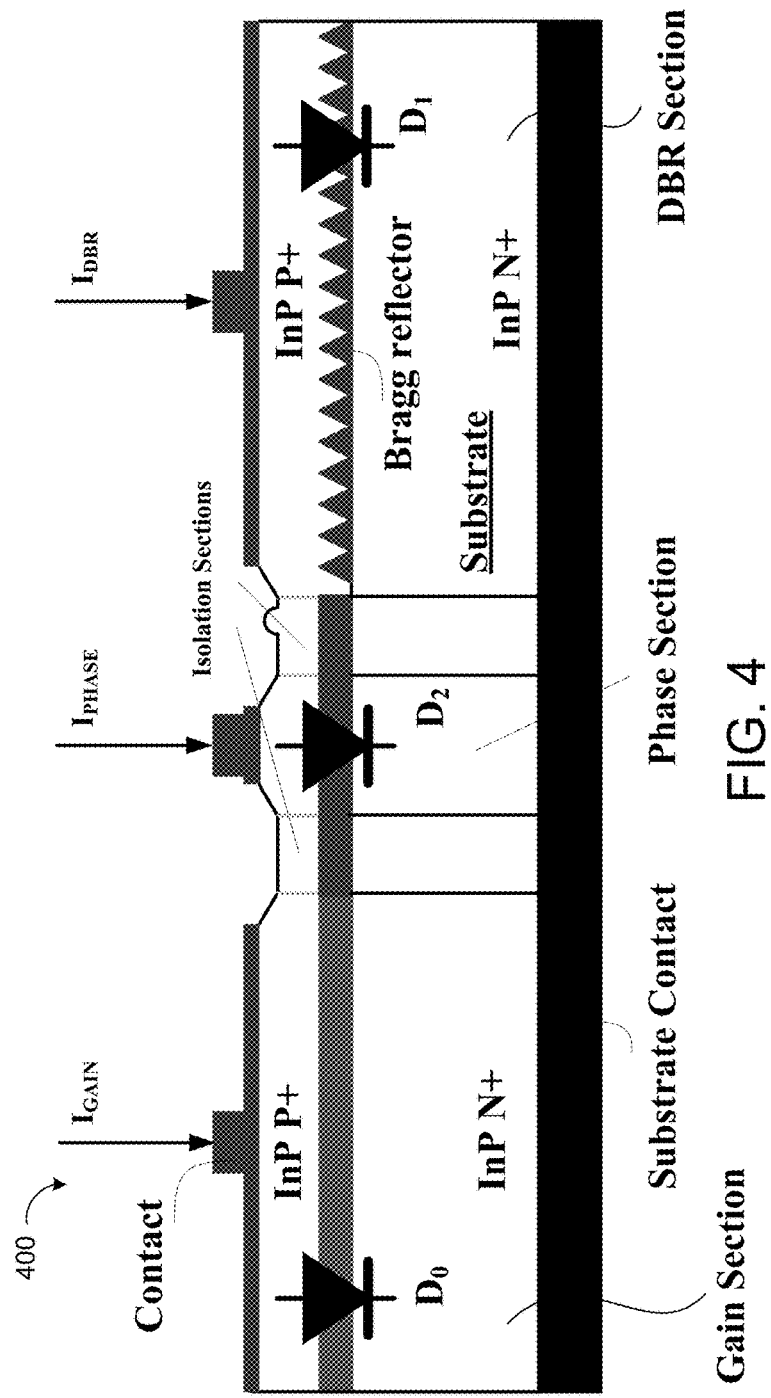
FIG. 4 is a schematic view of an example multi-section tunable laser.

FIG. 4 provides an example fully-tunable laser 400 for use by ONUs 140 in WDM-PON applications. The laser 400 may include a multi-section structure having a gain section, a DBR section, and a phase section. Generally, wavelength tuning is through refractive index changes of a Bragg reflector by adjustment of DBR injection currents ($I_{DBR}$) at the DBR section. The phase section may provide adjustable phase shifts for fine-turning the wavelength through a phase injection current ($I_{PHASE}$). In some implementations, temperature control is also used to fine-tune the wavelength.

The gain section may provide two functions: (1) generating a suitable optical power for achieving the transmission distance of the optical signal 104u to the OLT 120; and (2) generating information carried by the wavelength. The biasing circuit 500 may provide these functions through implementation of a biasing current and a modulation current, denoted as $I_{GAIN}$ in the example shown. The biasing current generates output power and the modulation current adds the information to the carrier wavelength.

In the example shown, each section has P doping anodes (InP P+) with N doping (InP N+) shared-substrate as the cathode, which is normally grounded during the application. The diodes ($D_0$, $D_1$, $D_2$) for the DBR tunable laser 400 all share the same cathode for circuit behaviors. Low-speed programmable digital to analog converters (DACs) can provide $I_{GAIN}$, $I_{DBR}$ and $I_{PHASE}$. Advancements in WDM-PON requires the laser 400 to have the ability to transmit and receive optical signals 104 across a wide wavelength tuning range. By expanding the wavelength tuning range through the use of the laser biasing circuit 500, the high complexity and incurred costs associated with refabricating the design of the laser 400 can be eliminated, to thereby individualize a greater number of ONUs to transmit/receive optical signals 104 across a wider wavelength tuning range.

Figure 5A:
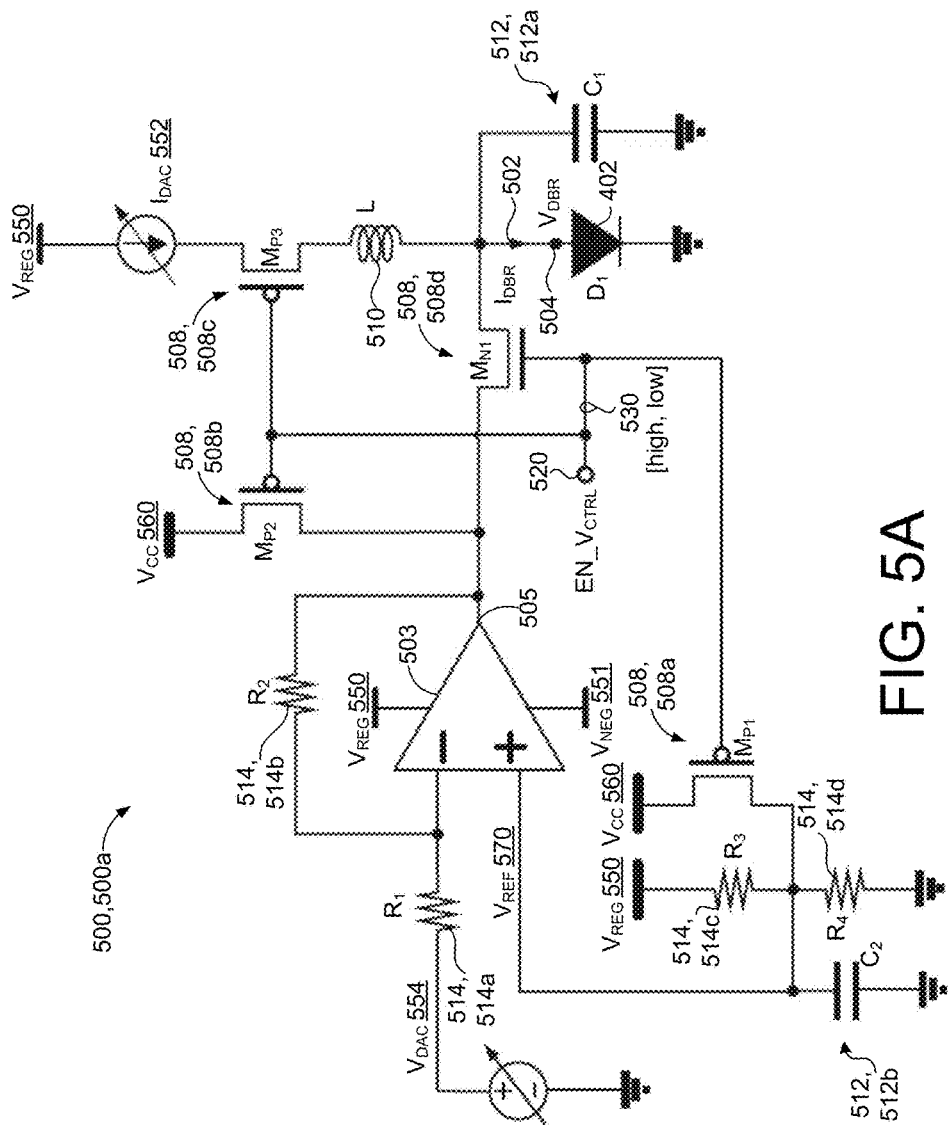
FIGS. 5A-5C are schematic views of an example laser biasing circuit including a current-mode bias sub-circuit (FIG. 5B) and a voltage-mode bias sub-circuit (FIG. 5C).
Figure 5B:
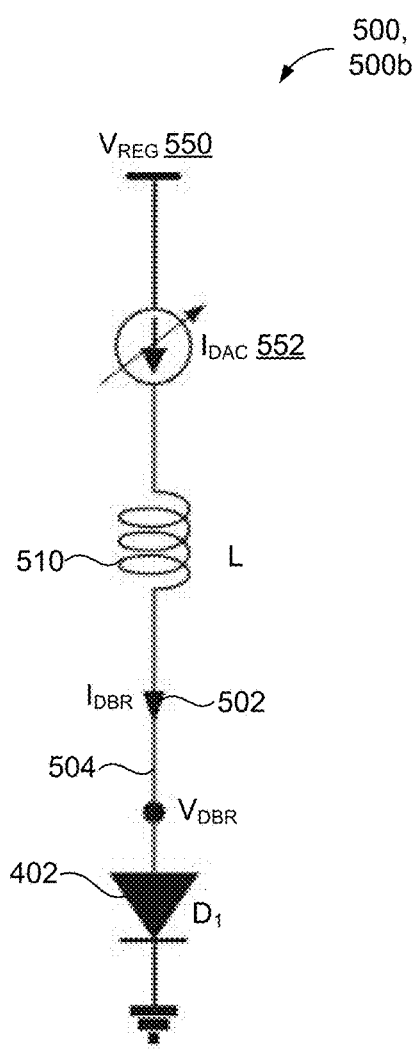
Figure 5C:
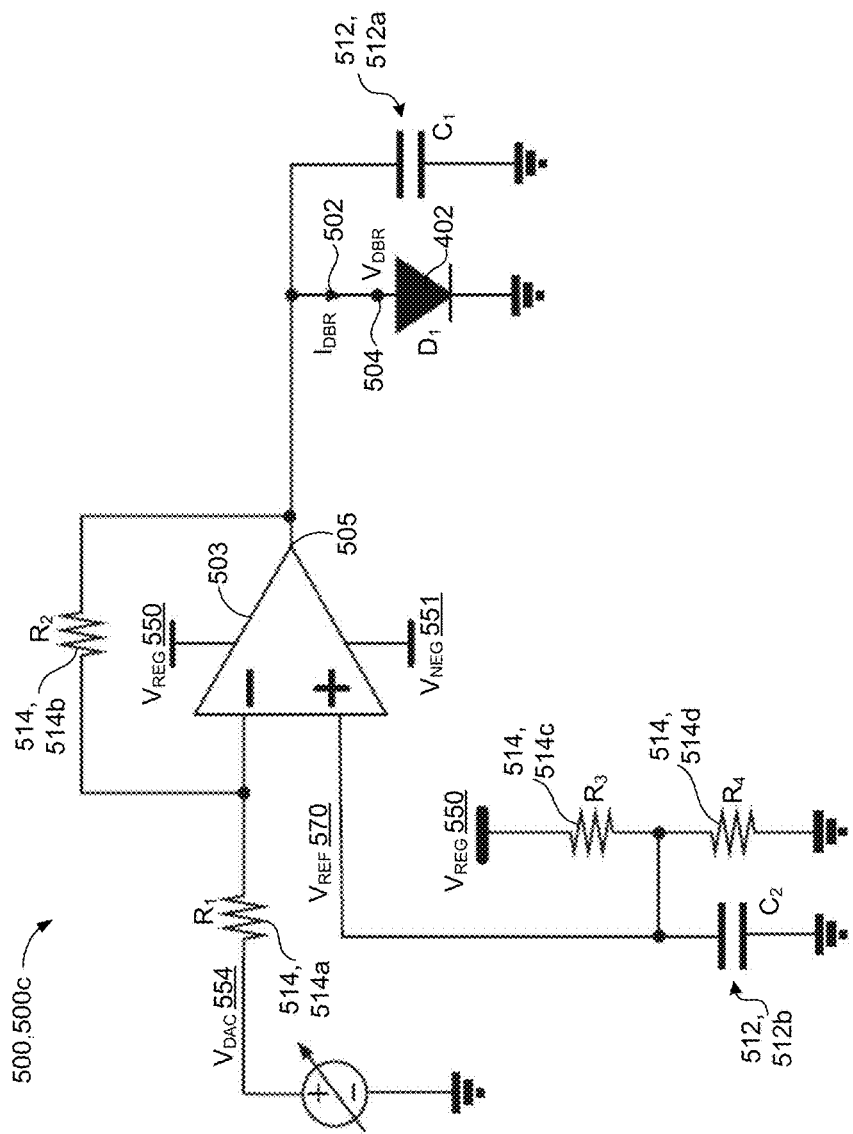

FIGS. 5A-5C provide schematic views of the laser biasing circuit 500, 500a-c for use in a fully-tunable ONU 140. The laser biasing circuit 500, 500a (FIG. 5A) includes a current-mode bias sub-circuit 500b (FIG. 5B) and a voltage-mode bias sub-circuit 500c. The current-mode bias sub-circuit 500b connects to the anode of the reflector-section diode 402 when the mode control signal 530 is indicative of the I-mode, while the voltage-mode bias sub-circuit 500c connects to the anode of the reflector-section diode 402 when the mode control signal 530 is indicative of the V-mode. Referring to FIG. 5A, the laser biasing circuit 500, 500a includes an operational amplifier (OP) 503, metal-oxide-semiconductor field-effect transistors (MOSFETs) ($M_{N1}$, $M_{P1}$-$M_{P3}$) 508, 508a-d, an inductor (L) 510, capacitors ($C_1$, $C_2$) 512, 512a-b, resistors ($R_1$-$R_4$) 514, 514a-d, and the reflector-section diode ($D_1$) 402. In some implementations, the circuit 500 may use Bipolar Junction Transistors (BJTs) instead of the MOSFETs 508 to perform switching operations.

Each MOSFET ($M_{P1}$-$M_{P3}$, $M_{N1}$) 508a-d is connected to a mode control signal source 520 and receives the mode control signal $EN\_V_{CTRL}$, 530 indicative of the current-mode (I-mode) or the voltage-mode (V-mode) from the mode control signal source 520. In the example shown, the $M_{N1}$ 508d includes an n-channel MOSFET (NMOS) and each of the $M_{P1}$ 508b, $M_{P2}$ 508c, and $M_{P3}$ 508d includes a p-channel MOSFET (PMOS). The NMOS $M_{N1}$ 508d is further connected to an output 505 of the operational amplifier (OP) 503 and to the anode of the reflector section diode $D_1$ 402, while the PMOS $M_{P3}$ 508c is further connected to a regulator voltage source ($V_{REG}$) 550 and to the anode of the reflector-section diode $D_1$ 402 through the inductor L 510. The PMOS $M_{P1}$ 508a is connected to a voltage source $V_{CC}$ 560 and to a positive input node (+) of the OP 503, while the PMOS $M_{P2}$ 508b is connected to the voltage source $V_{CC}$ 560 and to the output 505 of the OP 503.

In some implementations, a logically high mode control signal $EN\_V_{CTRL}$ 530 (e.g., $EN\_V_{CTRL}$=high) is indicative of the voltage-mode (V-mode) and causes the NMOS $M_{N1}$ 508d to turn ON and each of the PMOSs $M_{P1}$-$M_{P3}$ 508a-c to turn OFF. The logically high mode control signal $EN\_V_{CTRL}$ 530 may include a voltage level equal to a magnitude of the voltage source $V_{CC}$ 560. In these implementations, turning ON the $M_{N1}$ 508d connects the voltage-mode bias sub-circuit 500c to the anode of the reflector-section diode $D_1$ 402 by electrically connecting the output 505 of the operational amplifier (OP) 503 to the anode of the reflector-section diode $D_1$ 402. Therefore, an adjustable bias voltage $V_{DAC}$ 552 applied at a negative input node (−) of the OP 503 may bias the diode voltage $V_{DBR}$ 502 at the anode of the reflector-section diode $D_1$ 402 to cover the sub-threshold region or the reverse-bias region. Here, the output 505 at the OP 503 generates the diode voltage $V_{DBR}$ 502 at the anode of the reflector-section diode $D_1$ 402. As used herein, the $V_{DAC}$ 552 is programmable and includes a digital analog converter (DAC) signal whereby a digital input value outputs a corresponding voltage level for the $V_{DAC}$ 552. Moreover, causing the $M_{P3}$ 508c to turn OFF disconnects the current-mode bias sub-circuit 500b from the anode of the reflector-section diode $D_1$ 402 to prevent delivery of the adjustable bias current $I_{DAC}$ 554 to the anode of the reflector-section diode $D_1$ 402. Turning the $M_{P3}$ 508c to OFF to block the delivery of the $I_{DAC}$ 554 prevents interference from the I-mode and disturbance from supply ripples for minimizing wavelength drift by the tunable laser 400 during the V-mode.

Whereas the logically high $EN\_V_{CTRL}$ 530 is indicative of the voltage-mode, a logically low $EN\_V_{CTRL}$ 530 ($EN\_V_{CTRL}$=low) is indicative of the current-mode (I-mode) and causes each of the PMOSs $M_{P1}$-$M_{P3}$ 508a-c to turn ON and the NMOS $M_{N1}$ 508d to turn OFF. Here, turning ON the $M_{P3}$ 508c connects the current-mode bias sub-circuit 500b to the anode of the reflector-section diode $D_1$ 402 by electrically connecting the adjustable bias current $I_{DAC}$ 554 to the anode of the reflector-section diode $D_1$ 402. Accordingly, the regulator voltage source $V_{REG}$ 550 may generate and deliver the adjustable bias current $I_{DAC}$ 554 to bias the diode current $I_{DBR}$ 504 at the anode of the reflector-section diode $D_1$ 402 in the linear region. As used herein, the $I_{DAC}$ 554 includes a DAC signal whereby a digital input value outputs a corresponding current level for the $I_{DAC}$ 554. Moreover, causing the NMOS $M_{N1}$ 508d to turn OFF disconnects the voltage-mode bias sub-circuit 500c from the anode of the reflector-section diode $D_1$ 402 to isolate the adjustable bias voltage $V_{DAC}$ 552, as well as the resulting output 505 of the operational amplifier (OP) 503, from the anode of the reflector-section diode $D_1$ 402. Isolating the adjustable bias voltage $V_{DAC}$ 552 during the I-mode prevents interference from the V-mode and disturbance from supply ripples to minimize wavelength drift by the tunable laser 400 during the I-mode.

In the example shown, turning ON each of the PMOS $M_{P1}$ 508a and the PMOS $M_{P2}$ 508b prevents a negative voltage (e.g., a negative $V_{DBR}$ 502) at the output 505 of the operational amplifier 503 from causing the NMOS $M_{N1}$ 508d to inadvertently turn ON when the $EN\_V_{CTRL}$ 530 is logically low, i.e., indicative of the I-Mode. By turning ON the PMOS $M_{P1}$ 508a responsive to the logically low $EN\_V_{CTRL}$ 530, a reference voltage ($V_{REF}$) 570 at the positive input node (+) of the OP 503 pulls toward the voltage level of the voltage source $V_{CC}$ 560 to thereby drive the voltage at the output 505 of the operational amplifier 503 toward the output voltage of the regulator voltage source $V_{REG}$ 550. At the same time, by turning ON the PMOS $M_{P2}$ 508b responsive to the logically low $EN\_V_{CTRL}$ 530, the voltage at the output 505 of the OP 503 further pulls toward the voltage level of the $V_{CC}$ 560 from the voltage level of the $V_{REG}$ 550, and thereby reverse-bias the NMOS $M_{N1}$ 508d to completely shut-down and remain OFF. Accordingly, the PMOS $M_{P1}$ 508a and the PMOS $M_{P2}$ 508b cooperate to isolate the voltage-mode bias sub-circuit 500c from the current-mode bias sub-circuit 500b when the mode control signal 530 is indicative of the current-mode (I-mode) in scenarios when the output 505 of the operational amplifier 503 is negative even though a gate voltage at the NMOS $M_{N1}$ 508d may be zero voltage.

Referring to FIG. 5B, the current-mode bias sub-circuit 500b connects to the anode of the reflector-section diode $D_1$ 402 when the mode control signal $EN\_V_{CTRL}$ 530 is indicative of the current-mode, e.g., $EN\_V_{CTRL}$ 530 is logically low. During the current-mode (I-mode), the current-mode bias sub-circuit 500b delivers the adjustable bias current $I_{DAC}$ 554 to the anode of the reflector-section diode $D_1$ 402.

In some implementations, the regulator voltage source $V_{REG}$ 550 supplies the adjustable bias current $I_{DAC}$ 554 and the current-mode bias sub-circuit 500b provides a current pathway for the $I_{DAC}$ 554 to bias the diode current $I_{DBR}$ 504 in the linear region. Here, the reflector-section diode $D_1$ 402 receives the $I_{DBR}$ 504 equal to a magnitude of the adjustable bias current $I_{DAC}$ 554. Since wavelength stability strongly depends on the accuracy of the biased diode current $I_{DBR}$ 504, the use of the regulator voltage source $V_{REG}$ 550 by the current-mode bias sub-circuit 500b to supply the $I_{DAC}$ 554 is effective at suppressing current errors introduced by voltage noise that may otherwise occur if the circuit 500 were to instead share a supply voltage source $V_{CC}$ 560 with other blocks. The current-mode bias sub-circuit 500b may further include the inductor L 510 in series with the $V_{REG}$ 550 and the $I_{DAC}$ 554. The inductor L 510 may filter out any alternating-current (AC) noise of the $I_{DAC}$ 554 before the $I_{DAC}$ 554 biases the anode of the reflector-section diode $D_1$ 402.

Figure 6:
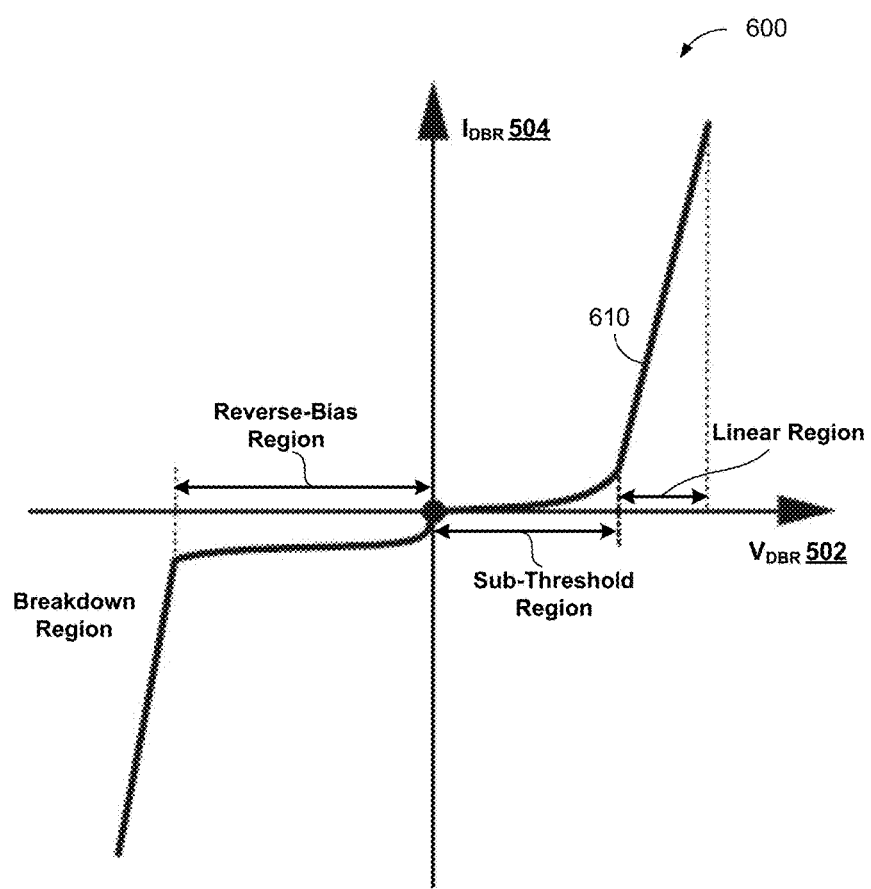
FIG. 6 is an example plot depicting diode current versus diode voltage when a reflector-section diode of a tunable laser is biased at a reverse-bias region, a sub-threshold region, and a linear region.

The current-mode bias sub-circuit 500b may bias the diode current $I_{DBR}$ 504 at the anode of the reflector-section diode $D_1$ 402 to tune the wavelength of the tunable laser 400. FIG. 6 illustrates a plot 600 depicting diode current $I_{DBR}$ 504 versus diode voltage $V_{DBR}$ 502 during the current-mode and the voltage-mode. The y-axis depicts the diode current $I_{DBR}$ 504 at the anode of the reflector-section diode $D_1$ 402 and the x-axis depicts the diode voltage $V_{DBR}$ 502 at the anode of the reflector-section diode $D_1$ 402. Profile line 610 depicts a magnitude of $I_{DBR}$ 504 against a magnitude of $V_{DBR}$ 502 when the anode of the reflector-section diode $D_1$ 402 is biased in each of a breakdown region, the reverse-bias region, the sub-threshold region, and the linear region. In the example plot 600, the current-mode bias sub-circuit 500b connects the anode of the reflector-section diode $D_1$ 402 during the I-mode to deliver the adjustable bias current $I_{DAC}$ 554 to bias the reflector-section diode $D_1$ 402 at the linear region, thereby tuning the wavelength of the tunable laser 400. In some examples, the adjustable bias current $I_{DAC}$ 554 biases the reflector-section diode $D_1$ 402 in the linear region above a laser threshold voltage to minimize wavelength drift. Moreover, the adjustable bias voltage $V_{DAC}$ 552 remains isolated from the anode of the reflector-section diode $D_1$ 402 to prevent disturbance from the V-mode (e.g., voltage-mode bias sub-circuit 500c) as the current-mode bias sub-circuit 500b biases the anode of the reflector-section diode $D_1$ 402 in the linear region.

Referring to FIGS. 5C and 6, the voltage-mode bias sub-circuit 500c maximizes/extends the wavelength tuning range of the tunable laser 400 by extending the bias regions of the reflector-section diode $D_1$ 402 to the sub-threshold region (FIG. 6) or the reverse-bias region (FIG. 6). In the example shown, the voltage-mode bias sub-circuit 500c connects the output 505 of the operational amplifier (OP) 503 to the anode of the reflector-section diode $D_1$ 402 when the mode control signal $EN\_V_{CTRL}$ 530 is indicative of the voltage-mode, e.g., $EN\_V_{CTRL}$ 530 is logically high. During the voltage-mode (V-mode), the voltage-mode bias sub-circuit 500c applies the adjustable bias voltage $V_{DAC}$ 552 to bias the diode voltage $V_{DBR}$ 502 at the anode of the reflector-section diode $D_1$ 402. As will become apparent, the magnitude of the diode voltage $V_{DBR}$ 502 may be negative to bias the $D_1$ 402 at the reverse-bias region or positive to bias the $D_1$ 402 at the sub-threshold region. The example plot 600 shows negative values of the diode voltage $V_{DBR}$ 502 biasing the $D_1$ 402 in the reverse-bias region and positive values of the diode voltage $V_{DBR}$ 502 biasing the $D_1$ 402 in the sub-threshold region.

The voltage-mode bias sub-circuit 500c shows the first and second resistors $R_1$ 514a, $R_2$ 514b providing a feedback divider and the regulator voltage $V_{REG}$ 560 and the third and fourth resistors $R_3$ 514c, $R_4$ 514d providing a voltage divider. In some implementations, the operational amplifier 503, the adjustable bias voltage $V_{DAC}$ 552, the feedback divider ($R_1$, $R_2$), and the voltage divider ($V_{REG}$, $R_3$, $R_4$) collectively form a negative feedback loop configured to generate the diode voltage $V_{DBR}$ 502 at the output 505 of OP 503 for biasing the anode of the reflector-section diode $D_1$ 402. For instance, the diode voltage $V_{DBR}$ 502 generated by the negative feedback loop may be represented as follows.

$$V_{DBR} = \left(1 + \frac{R_2}{R_1}\right)V_{REF} - \frac{R_2}{R_1}V_{DAC} \quad (1)$$

where the reference voltage $V_{REF}$ 570 may be represented as follows.

$$V_{REF} = \frac{1}{1 + \frac{R_3}{R_4}} V_{REG} \quad (2)$$

Accordingly, Equations (1) and (2) show that values for the ratio of $R_2/R_1$, the ratio of $R_3/R_4$, and the adjustable bias voltage $V_{DAC}$ 552 can be chosen/selected to generate either a positive diode voltage $V_{DBR}$ 502 to cover the sub-threshold region (FIG. 6) or a negative diode voltage $V_{DBR}$ 502 to cover the reverse-bias region (FIG. 6). The extended biasing allows the tunable laser 400 to generate more wavelengths for transmitting and receiving optical signals 104 to and from the OLT 120.

In the example shown, the operational amplifier OP 503 includes a full-swing output range from a negative voltage $V_{NEG}$ 551, supplying a lowest voltage to the OP 503, to a positive voltage output from the regulator voltage source $V_{REG}$ 550, supplying a highest voltage to the OP 503. In some examples, a negative voltage generator generates the $V_{NEG}$ 551. In other examples, a single power management integrated circuit (PMIC) generates both the positive voltage of the regulator voltage source $V_{REG}$ 550 and the negative voltage $V_{NEG}$ 551 from the voltage source $V_{CC}$ 560. Moreover, the voltage-mode bias sub-circuit 500c may include the first parallel capacitor $C_1$ 512a for filtering out AC noise from the $V_{DBR}$ 502 at the anode of the reflector-section diode $D_1$ 402 and/or the second parallel capacitor $C_2$ 512b for filtering out AC noise at the positive input node (+) of the OP 504 from the voltage source $V_{CC}$ 560.

Figure 7:
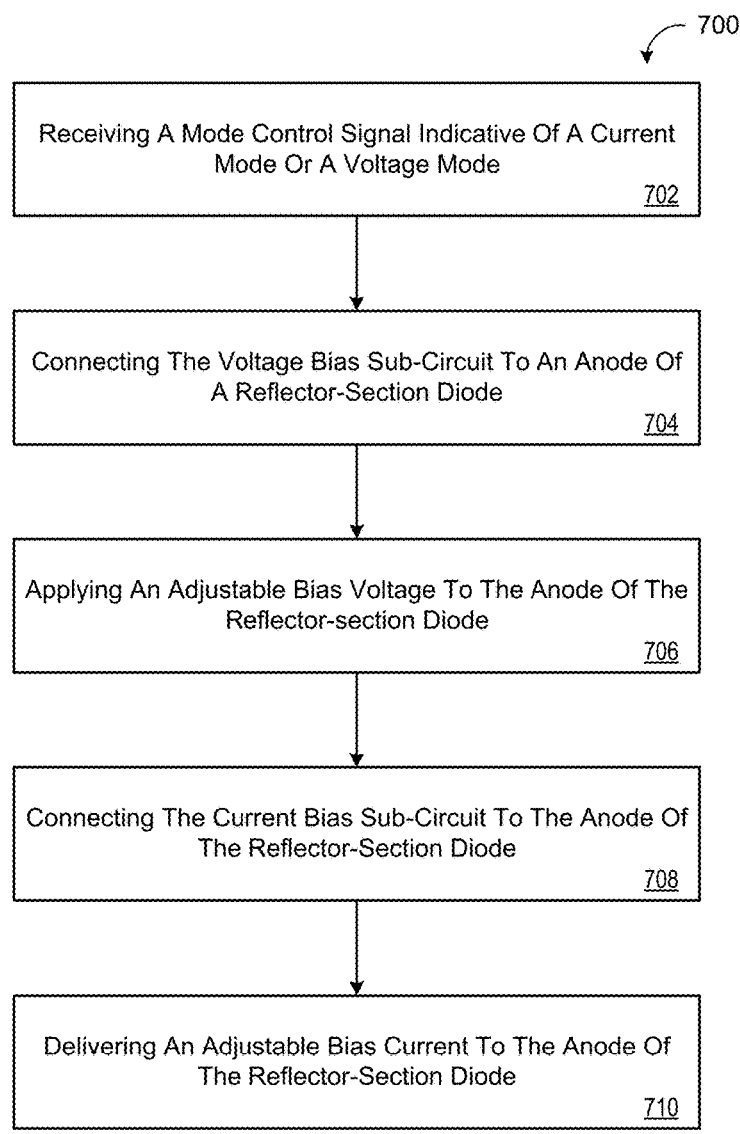
FIG. 7 is a schematic view of an example arrangement of operations for a method of expanding a wavelength tuning range of a tunable laser.

FIG. 7 is a flowchart of an example method 700 for extending a wavelength tuning range and wavelength tuning a tunable laser 400 through a laser biasing circuit 500 that biases an anode of a reflector-section diode $D_1$ 402. The flowchart may be described with reference to FIGS. 4, 5A-5C, and 6. The tunable laser 400 may include a distributed Bragg reflector (DBR) laser 400 including a multi-section structure having a gain section, a DBR section, and a phase section. Accordingly, the reflector-section diode $D_1$ 402 may correspond to a DBR-section diode $D_1$ disposed on a shared-substrate with the gain section and the phase section. The laser biasing circuit 500 includes a current-mode bias sub-circuit 500b (FIG. 5B) and a voltage-mode bias sub-circuit 500c (FIG. 5C).

The flowchart starts at operation 702 when the laser biasing circuit 500 receives a mode control signal $EN\_V_{CTRL}$ 530 indicative of a current-mode (I-mode) or a voltage-mode (V-mode). In some examples, a logically high $EN\_V_{CTRL}$ 530 is indicative of the V-mode and a logically low $EN\_V_{CTRL}$ 530 is indicative of the I-mode. For instance, a logically high $EN\_V_{CTRL}$ 530 may include a voltage level equal to a magnitude of a voltage source $V_{CC}$ 560 while a logically low $EN\_V_{CTRL}$ 530 may include a zero voltage or voltage level near zero.

At operation 704, when the $EN\_V_{CTRL}$ 530 is indicative of the V-mode, the laser biasing circuit 500 connects the voltage-mode bias sub-circuit 500c to the anode of the reflector-section diode $D_1$ 402 (e.g., DBR-section diode). Here, the NMOS $M_{N1}$ 508d is connected to the mode control signal source 520 and turns ON when the $EN\_V_{CTRL}$ 530 is indicative of the V-mode to electrically connect an output 505 of an operational amplifier (OP) 503 to the reflector-section diode $D_1$ 402. At the same time, the $EN\_V_{CTRL}$ 530 being indicative of the V-mode causes the voltage biasing circuit 500 to disconnect the current-mode bias sub-circuit 500b from the anode of the reflector-section diode $D_1$ 402 to prevent deliver of an adjustable bias current $I_{DAC}$ 554 to the reflector-section diode $D_1$ 402. For instance, the PMOS $M_{P3}$ 508c connected to the mode control signal source 520 turns OFF when the $EN\_V_{CTRL}$ 530 is indicative of the V-mode to disconnect the current-mode bias sub-circuit 500b.

At operation 706, the method 700 includes the voltage-mode bias sub-circuit 500c applying an adjustable bias voltage $V_{DAC}$ 552 to bias a diode voltage $V_{DBR}$ 502 at the anode of the reflector-section diode $D_1$ 402. In some examples, a positive diode voltage $V_{DBR}$ 502 extends the biasing at the reflector-section diode $D_1$ 402 to cover a sub-threshold region and a negative diode voltage $V_{DBR}$ 502 extends the biasing at the reflector-section diode $D_1$ 402 to cover the reverse-bias region. Here, the extended biasing is effective to extend/expand the wavelength tuning range of the tunable laser 400 to allow ONUs 140 to generate more wavelengths for transmitting and receiving optical signals to and from the OLT 120.

In some examples, the voltage-mode bias sub-circuit 500c includes first and second resistors $R_1$ 514a, $R_2$ 514b providing a feedback divider, and a regulator voltage $V_{REG}$ 560 and third and fourth resistors $R_3$ 514c, $R_4$ 514d providing a voltage divider. Accordingly, the operational amplifier 404, the adjustable bias voltage $V_{DAC}$ 552, the feedback divider ($R_1$, $R_2$), and the voltage divider ($V_{REG}$, $R_3$, $R_4$) may collectively form a negative feedback loop configured to generate the diode voltage $V_{DBR}$ 502 at the output 505 of the OP 503 for biasing the anode of the reflector-section diode $D_1$ 402. Equations (1) and (2) show that the value of the diode voltage $V_{DBR}$ 502 generated by the negative feedback loop at the output 505 of the OP 503 is dependent upon the magnitudes of the $V_{DAC}$ 552 and the $V_{REG}$ 550, as well as the ratios between $R_2/R_1$ and $R_3/R_4$.]

At operation 708, when the $EN\_V_{CTRL}$ 530 is indicative of the I-mode, the laser biasing circuit 500 connects the current-mode bias sub-circuit 500b to the anode of the reflector-section diode $D_1$ 402. Here, the logically low $EN\_V_{CTRL}$ 530 causes the PMOS $M_{P3}$ 508c to now turn ON and connect the current-mode bias sub-circuit 500b while simultaneously causing the NMOS $M_{N1}$ 508c to turn OFF and disconnect the voltage-mode bias sub-circuit 500c from the reflector-section diode $D_1$ 402. To prevent the NMOS $M_{N1}$ 508c from unintentionally turning ON responsive to a negative voltage (e.g., $V_{DBR}$ 502) at the output 505 of the operational amplifier 503 during the I-mode, the PMOSs $M_{P1}$ 508a, $M_{P2}$ 508b may be provided to reverse-biases the NMOS $M_{N1}$ 508d to completely shut-down and remain OFF.

For instance, the logically low EN_V$_{CTRL}$ 530 may cause the PMOS M$_{P1}$ 508a to turn ON to pull the V$_{REF}$ 570 at the positive input node (+) of the OP 503 toward the voltage level of the voltage source V$_{CC}$ 560 and thereby drive the voltage at the output 505 of the operational amplifier 503 toward the output voltage of the regulator voltage source V$_{REG}$ 550. At the same time, the logically low EN_V$_{CTRL}$ 530 may cause the PMOS M$_{P2}$ 508b to also turn ON to pull the voltage at the output 505 of the OP 503 toward the positive voltage level of the V$_{CC}$ 560 from the voltage level of the V$_{REG}$ 550 to effectively reverse-bias the NMOS M$_{N1}$ 508d to the OFF state.

At operation 710, the method 700 includes the current-mode bias sub-circuit 500b delivering an adjustable bias current I$_{DAC}$ 554 to the anode of the reflector-section diode D$_1$ 402. Here, the reflector-section diode D$_1$ 402 receives a diode current I$_{DBR}$ 504 equal to a magnitude of the adjustable bias current I$_{DAC}$ 554. When turned ON, the PMOS M$_{P1}$ 508c connects the V$_{REG}$ 550 and the inductor (L) 510 in series to provide a current pathway for delivering the adjustable bias current I$_{DAC}$ 554 to bias the diode current I$_{DBR}$ at the anode of the reflector-section diode D$_1$ 402 in the linear region. The adjustable bias current I$_{DAC}$ may bias the tunable laser 400 in the linear region in order to tune the tunable laser 400 to generate the desired transmit wavelength $\lambda_{Tx}$.

Figure 8:
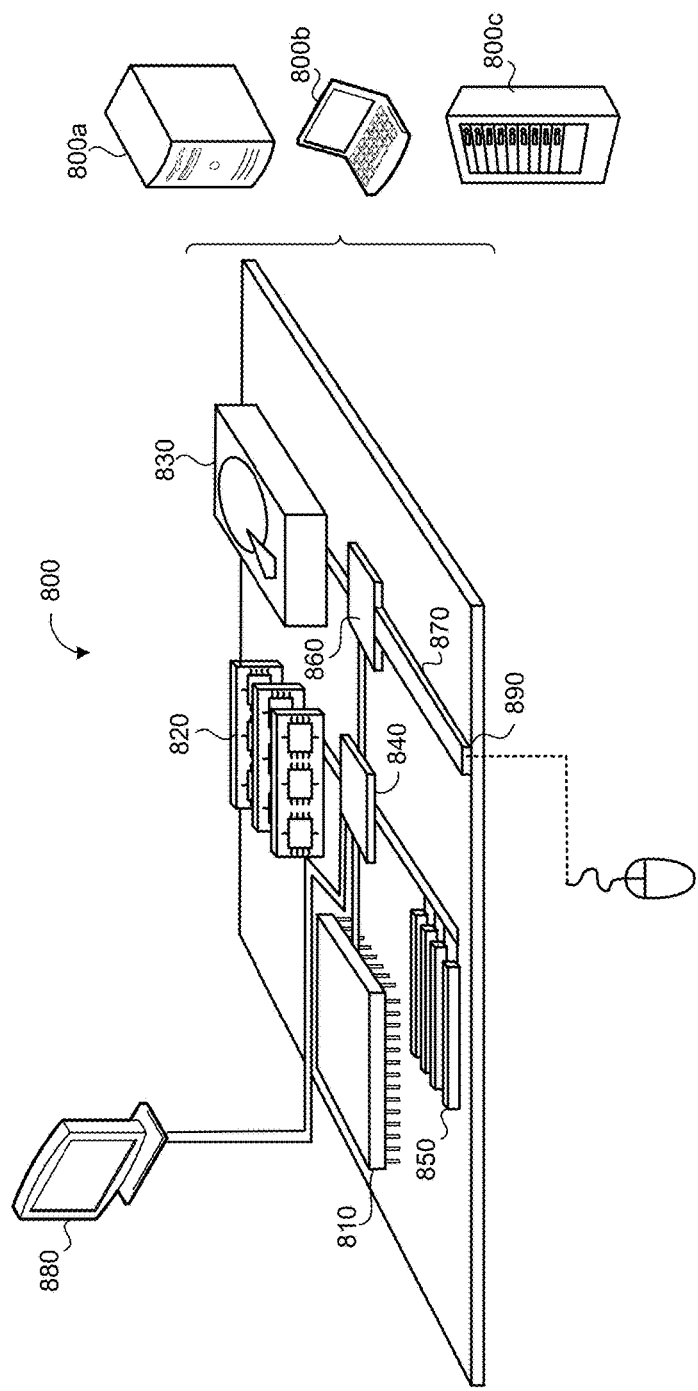
FIG. 8 is schematic view of an example computing device that may be used to implement the systems and methods described in this document.

FIG. 8 is a schematic view of an example computing device 800 that may be used to implement and control the systems and methods described in this document, for example, to program the magnitudes of I$_{DAC}$, V$_{DAC}$ control the voltage level of the mode control signal EN_V$_{CTRL}$, 530. The computing device 800 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 800 includes a processor 810, memory 820, a storage device 830, a high-speed interface/controller 840 connecting to the memory 820 and high-speed expansion ports 880, and a low speed interface/controller 860 connecting to low speed bus 870 and storage device 830. Each of the components 810, 820, 830, 840, 850, and 860, are interconnected using various busses, and may be mounted on a common motherboard or in other manners as appropriate. The processor 810 can process instructions for execution within the computing device 800, including instructions stored in the memory 820 or on the storage device 830 to display graphical information for a graphical user interface (GUI) on an external input/output device, such as display 880 coupled to high speed interface 840. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 820 stores information non-transitorily within the computing device 800. The memory 820 may be a computer-readable medium, a volatile memory unit(s), or non-volatile memory unit(s). The non-transitory memory 820 may be physical devices used to store programs (e.g., sequences of instructions) or data (e.g., program state information) on a temporary or permanent basis for use by the computing device 800. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 830 is capable of providing mass storage for the computing device 800. In some implementations, the storage device 830 is a computer-readable medium. In various different implementations, the storage device 830 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 820, the storage device 830, or memory on processor 810.

The high speed controller 840 manages bandwidth-intensive operations for the computing device 800, while the low speed controller 860 manages lower bandwidth-intensive operations. Such allocation of duties is exemplary only. In some implementations, the high-speed controller 840 is coupled to the memory 820, the display 880 (e.g., through a graphics processor or accelerator), and to the high-speed expansion ports 850, which may accept various expansion cards (not shown). In some implementations, the low-speed controller 860 is coupled to the storage device 830 and low-speed expansion port 870. The low-speed expansion port 870, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 800a or multiple times in a group of such servers 800a, as a laptop computer 800b, or as part of a rack server system 800c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
   receiving, at a laser biasing circuit, a mode control signal indicative of a current-mode or a voltage-mode, the laser biasing circuit comprising:
   an operational amplifier;
   an electronic switching device comprising one of a metal-oxide-semiconductor field-effect transistor (MOSFET) or a bipolar junction transistor (BJT), the electronic switching device connected to an output of the operational amplifier and to an anode of a reflector-section diode, the reflector-section diode disposed on a shared substrate of a tunable laser;
   a current-mode bias sub-circuit; and
   a voltage-mode bias sub-circuit;
   when the mode control signal is indicative of the voltage-mode:
   connecting, by the laser biasing circuit, the voltage-mode bias sub-circuit to the anode of the reflector-section diode by electrically connecting the output of the operational amplifier to the anode of the reflector-section diode through the electronic switching device; and
   applying, by the voltage-mode bias sub-circuit, an adjustable bias voltage to bias a diode voltage at the anode of the reflector-section diode; and
   when the mode control signal is indicative of the current-mode:
   connecting, by the laser biasing circuit, the current-mode bias sub-circuit to the anode of the reflector-section diode; and
   delivering, by the current-mode bias sub-circuit, an adjustable bias current to the anode of the reflector-section diode.

2. The method of claim 1, further comprising, when the mode control signal is indicative of the current-mode, disconnecting the voltage-mode bias sub-circuit from the anode of the reflector-section diode to isolate the adjustable bias voltage from biasing the diode voltage at the anode of the reflector-section diode.

3. The method of claim 1, further comprising, when the mode control signal is indicative of the voltage-mode, disconnecting the current-mode bias sub-circuit from the anode of the reflector-section diode to prevent delivery of the adjustable bias current to the anode of the reflector-section diode.

4. The method of claim 1, wherein when the mode control signal is indicative of the current-mode, the reflector-section diode receives a diode current equal to a magnitude of the adjustable bias current.

5. The method of claim 1, wherein when the mode control signal is indicative of the voltage-mode, the diode voltage at the anode of the reflector-section diode is negative or positive based on a magnitude of the adjustable bias voltage applied by the voltage-mode bias sub-circuit.

6. The method of claim 1, wherein a magnitude of a diode current received by the reflector-section diode is less when the mode control signal is indicative of the voltage-mode than when the mode control signal is indicative of the current-mode.

7. The method of claim 1, wherein the tunable laser comprises a multi-section tunable laser.

8. A method comprising:
   receiving, at a laser biasing circuit, a mode control signal indicative of a current-mode or a voltage mode, the laser biasing circuit comprising a current-mode bias sub-circuit, a voltage-mode bias sub-circuit and first and second metal-oxide-semiconductor field-effect transistors (MOSFETs), each MOSFET connected to a mode control signal source, the first MOSFET connected to an anode of a reflector-section diode and to an output of an operational amplifier, the operational amplifier having a negative input node connected to a first resistor, the first resistor connected to an adjustable voltage bias source, the second MOSFET connected to a regulator voltage source and an inductor, the inductor connected to the anode of the reflector-section diode;

when the mode control signal is indicative of the voltage-mode:
connecting, by the laser biasing circuit, the voltage-mode bias sub-circuit to the anode of the reflector-section diode, the reflector-section diode disposed on a shared substrate of a tunable laser; and
applying, by the voltage-mode bias sub-circuit, an adjustable bias voltage to bias a diode voltage at the anode of the reflector-section diode; and when the mode control signal is indicative of the current-mode:
connecting, by the laser biasing circuit, the current-mode bias sub-circuit to the anode of the reflector-section diode; and
delivering, by the current-mode bias sub-circuit, an adjustable bias current to the anode of the reflector-section diode.

9. The method of claim 8, wherein when the mode control signal is indicative of the voltage-mode, the first MOSFET is configured to turn on to apply the adjustable bias voltage to bias the diode voltage at the anode of the reflector-section diode.

10. The method of claim 8, wherein when the mode control signal is indicative of the current-mode, the second MOSFET is configured to turn on to deliver the adjustable bias current from the regulator voltage source to the anode of the reflector-section diode.

11. The method of claim 8, wherein the first MOSFET comprises an n-channel MOSFET and the second MOSFET comprises a p-channel MOSFET.

12. A method comprising:
receiving, at a laser biasing circuit, a mode control signal indicative of a current-mode or a voltage-mode, the laser biasing circuit comprising a current-mode bias sub-circuit, a voltage-mode bias sub-circuit and first and second metal-oxide-semiconductor field-effect transistors (MOSFETs), the MOSFETs each connected to a mode control signal source and a voltage source, the first MOSFET connected to a positive input node of an operational amplifier, the second MOSFET connected to an output of the operational amplifier;

when the mode control signal is indicative of the voltage-mode:
connecting, by the laser biasing circuit, the voltage-mode bias sub-circuit to an anode of a reflector-section diode, the reflector-section diode disposed on a shared substrate of a tunable laser; and
applying, by the voltage-mode bias sub-circuit, an adjustable bias voltage to bias a diode voltage at the anode of the reflector-section diode; and when the mode control signal is indicative of the current-mode:
connecting, by the laser biasing circuit, the current-mode bias sub-circuit to the anode of the reflector-section diode; and
delivering, by the current-mode bias sub-circuit, an adjustable bias current to the anode of the reflector-section diode.

13. The method of claim 12, wherein when the mode control signal is indicative of the current-mode, the first and second MOSFETs are configured to turn on.

14. A laser biasing circuit comprising:
a voltage-mode bias sub-circuit;
a current-mode bias sub-circuit; and
first and second MOSFETs configured to receive a mode control signal indicative of a current-mode or a voltage-mode, wherein when the mode control signal is indicative of the voltage-mode, the voltage-mode bias sub-circuit is configured to:
connect to an anode of a reflector-section diode, the reflector-section diode disposed on a shared substrate of a tunable laser; and
apply an adjustable bias voltage to bias a diode voltage at the anode of the reflector-section diode, and wherein when the mode control signal is indicative of the current-mode, the current-mode bias sub-circuit is configured to:
connect to the anode of the reflector-section diode; and
deliver an adjustable bias current to the anode of the reflector-section diode.

15. The laser biasing circuit of claim 14, wherein when the mode control signal is indicative of the current-mode, the voltage-mode bias sub-circuit is configured to disconnect from the anode of the reflector-section diode to isolate the adjustable bias voltage from biasing the diode voltage at the anode of the reflector-section diode.

16. The laser biasing circuit of claim 14, wherein when the mode control signal is indicative of the voltage-mode, the current-mode bias sub-circuit is configured to disconnect from the anode of the reflector-section diode to prevent delivery of the adjustable bias current to the anode of the reflector-section diode.

17. The laser biasing circuit of claim 14, wherein when the mode control signal is indicative of the current-mode, the reflector-section diode receives a diode current equal to a magnitude of the adjustable bias current.

18. The laser biasing circuit of claim 14, wherein when the mode control signal is indicative of the voltage-mode, the diode voltage at the anode of the reflector-section diode is negative or positive based on a magnitude of the adjustable bias voltage applied by the voltage-mode bias sub-circuit.

19. The laser biasing circuit of claim 14, wherein a magnitude of a diode current received by the reflector-section diode is less when the mode control signal is indicative of the voltage-mode than when the mode control signal is indicative of the current-mode.

20. The laser biasing circuit of claim 14, wherein:
the first MOSFET is further connected to the anode of the reflector-section diode and to an output of an operational amplifier, the operational amplifier having a negative input node connected to a first resistor, the first resistor connected to an adjustable voltage bias source; and
the second MOSFET is further connected to a regulator voltage source and an inductor, the inductor connected to the anode of the reflector-section diode.

21. The laser biasing circuit of claim 20, wherein the first MOSFET is configured to turn on to apply the adjustable bias voltage to bias the diode voltage at the anode of the reflector-section diode when the mode control signal is indicative of the voltage-mode.

22. The laser biasing circuit of claim 20, wherein the second MOSFET is configured to turn on to deliver the adjustable bias current from the regulator voltage source to the anode of the reflector-section diode when the mode control signal is indicative of the current-mode.

23. The laser biasing circuit of claim 20, wherein the first MOSFET comprises an n-channel MOSFET and the second MOSFET comprises a p-channel MOSFET.

24. The laser biasing circuit of claim 14, further comprising:
- a third MOSFET connected to a voltage source and a positive input node of an operational amplifier, the third MOSFET configured to receive the mode control signal indicative of the current-mode or the voltage-mode; and
- a fourth MOSFET connected to the voltage source and an output of the operational amplifier.

25. The laser biasing circuit of claim 24, wherein the third and fourth MOSFETS are configured to turn on when the mode control signal is indicative of the current-mode.

26. The laser biasing circuit of claim 14, wherein the tunable laser comprises a multi-section tunable laser.

* * * * *